United States Patent
Kim

(10) Patent No.: US 9,875,807 B2
(45) Date of Patent: Jan. 23, 2018

(54) SEMICONDUCTOR MEMORY APPARATUS CONVERTING SERIAL TYPE DATA INTO PARALLEL TYPE DATA IN RESPONSE TO PIPE CONTROL SIGNALS AND PIPE CONTROL SIGNALS DURING A TRAINING OPERATION

(71) Applicant: SK hynix Inc., Icheon-si Gyeonggi-do (KR)

(72) Inventor: Jae Il Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/488,521

(22) Filed: Sep. 17, 2014

(65) Prior Publication Data

US 2015/0332742 A1    Nov. 19, 2015

(30) Foreign Application Priority Data

May 13, 2014    (KR) .................. 10-2014-0057137

(51) Int. Cl.
| | |
|---|---|
| *G11C 19/00* | (2006.01) |
| *G11C 7/10* | (2006.01) |
| *G11C 29/02* | (2006.01) |
| *G11C 29/28* | (2006.01) |
| *G11C 29/32* | (2006.01) |

(52) U.S. Cl.
CPC .............. *G11C 19/00* (2013.01); *G11C 7/109* (2013.01); *G11C 7/1039* (2013.01); *G11C 7/1063* (2013.01); *G11C 7/1087* (2013.01); *G11C 29/022* (2013.01); *G11C 29/28* (2013.01); *G11C 29/32* (2013.01); *G11C 7/106* (2013.01); *G11C 2207/107* (2013.01); *G11C 2207/2254* (2013.01)

(58) Field of Classification Search
CPC ..... G11C 7/1039; G11C 7/106; G11C 7/1063; G11C 7/1087; G11C 7/109; G11C 7/1006; G11C 7/1051; G11C 7/10; G11C 7/1078
USPC ............ 365/189.05, 49.11, 154, 189.12, 240
See application file for complete search history.

(56) References Cited

U.S. PATENT DOCUMENTS

| | | | | |
|---|---|---|---|---|
| 5,231,604 | A * | 7/1993 | Watanabe | G11C 29/846 365/189.05 |
| 2007/0070677 | A1* | 3/2007 | Shin | G11C 7/1039 365/78 |
| 2010/0246279 | A1* | 9/2010 | Kim | G11C 7/1039 365/189.05 |

(Continued)

FOREIGN PATENT DOCUMENTS

| | | |
|---|---|---|
| KR | 1020080076087 A | 8/2008 |
| KR | 1020100108792 A | 10/2010 |

*Primary Examiner* — Thao H Bui
*Assistant Examiner* — Alfredo Bermudez Lozada
(74) *Attorney, Agent, or Firm* — William Park & Associates Ltd.

(57) ABSTRACT

A semiconductor memory apparatus may include a data conversion control block configured to control the number of pipe input control signals and the number of pipe output control signals which are enabled, in response to a training control signal. The semiconductor memory apparatus may also include a data conversion block configured to receive parallel data and output serial data, in response to the pipe input control signals and the pipe output control signals.

9 Claims, 8 Drawing Sheets

(56) References Cited

U.S. PATENT DOCUMENTS

2012/0008422 A1* 1/2012 Kim .................. G11C 7/04
365/189.05

* cited by examiner

SEMICONDUCTOR MEMORY APPARATUS CONVERTING SERIAL TYPE DATA INTO PARALLEL TYPE DATA IN RESPONSE TO PIPE CONTROL SIGNALS AND PIPE CONTROL SIGNALS DURING A TRAINING OPERATION

CROSS-REFERENCES TO RELATED APPLICATION

The present application claims priority under 35 U.S.C. §119(a) to Korean application number 10-2014-0057137, filed on May 13, 2014, in the Korean Intellectual Property Office, which is incorporated herein by reference in its entirety.

BACKGROUND

1. Technical Field

Various embodiments generally relate to a semiconductor integrated circuit, and more particularly, to a semiconductor memory apparatus.

2. Related Art

A semiconductor memory apparatus is configured to receive and store data and output stored data. The semiconductor memory apparatus may receive serial type data from outside the semiconductor memory apparatus or exterior to the semiconductor memory apparatus. Then the semiconductor memory apparatus may internally convert the serial type data into parallel type data, and store the converted parallel type data. When the semiconductor memory apparatus outputs the stored data, the parallel type data is converted into serial type data. Then the converted serial type data may be outputted from the semiconductor memory apparatus external to, for example, a device external to the semiconductor memory apparatus.

After the semiconductor memory apparatus is mounted to a system, a training operation for optimizing the operation margin between the system and the semiconductor memory apparatus may be performed.

SUMMARY

In an embodiment, a semiconductor memory apparatus may include a data conversion control block configured to control the number of pipe input control signals and the number of pipe output control signals which are enabled, in response to a training control signal. The semiconductor memory apparatus may also include a data conversion block configured to receive parallel data and output serial data, in response to the pipe input control signals and the pipe output control signals.

In an embodiment, a semiconductor memory apparatus may include a data conversion block including a plurality of pipe latches, and configured to sequentially output a plurality of parallel data as serial data by using the plurality of pipe latches. The semiconductor memory apparatus may also include a data conversion control block configured to select the number of the pipe latches in response to a training control signal, a pipe input signal and a pipe output signal, and control the data conversion block to output the same number of parallel data as the selected number of the pipe latches, as the serial data.

DETAILED DESCRIPTION

Hereinafter, a semiconductor memory apparatus will be described below with reference to the accompanying drawings through various examples of embodiments.

Figure 1:
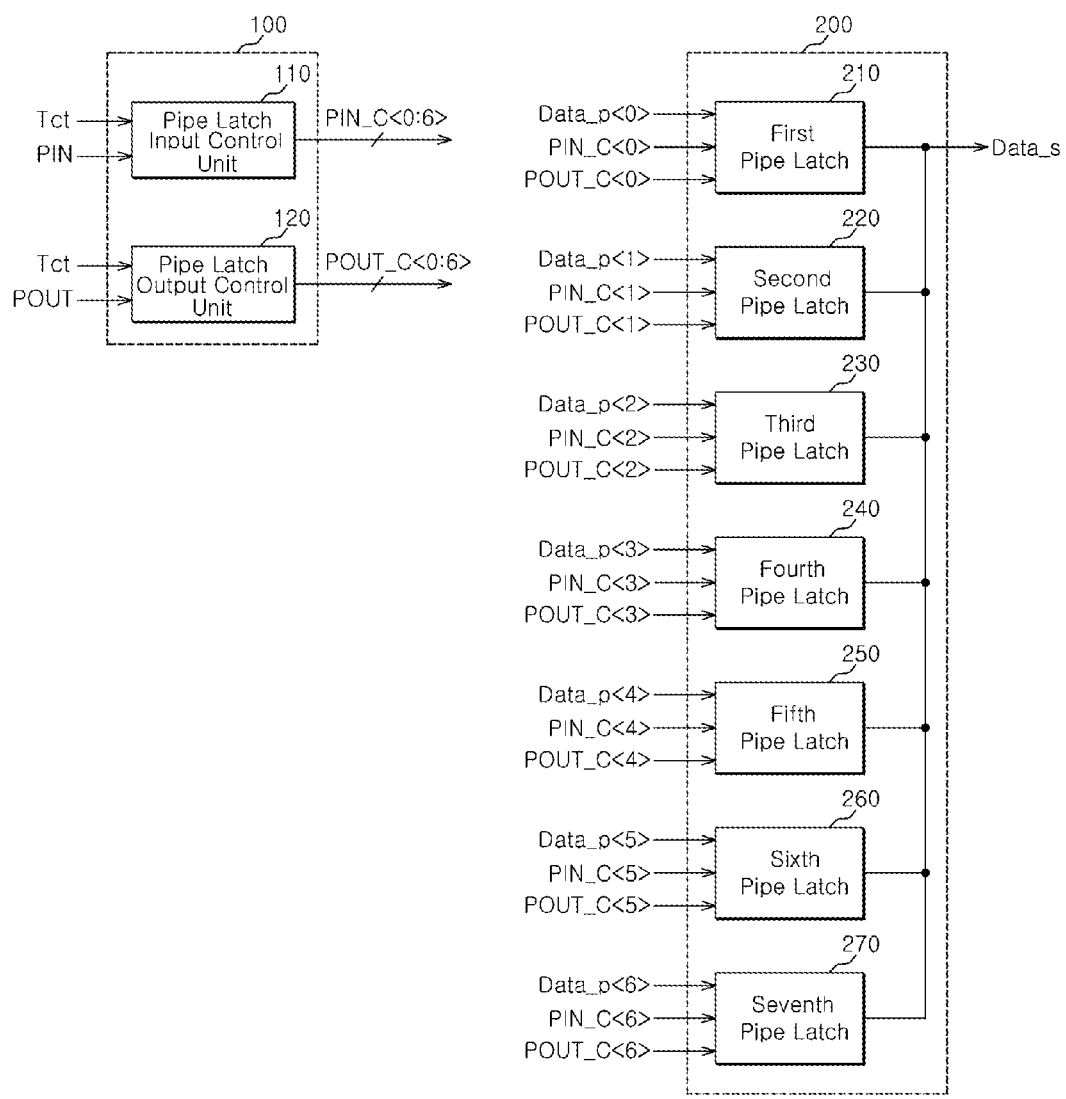
FIG. 1 is a configuration diagram illustrating a representation of a semiconductor memory apparatus in accordance with an embodiment.

Referring to FIG. 1, a semiconductor memory apparatus in accordance with an embodiment may include a data conversion control block 100, and a data conversion block 200.

The data conversion control block 100 may generate first to seventh pipe input control signals PIN_C<0:6> in response to a pipe input signal PIN, and a training control signal Tct. The data conversion control block 100 may generate first to seventh pipe output control signals POUT_C<0:6> in response to a pipe output signal POUT and a training control signal Tct. For example, the data conversion control block 100 may sequentially enable the first to seventh pipe input control signals PIN_C<0:6> each time the pipe input signal PIN transitions to a specified level when the training control signal Tct is disabled. The data conversion control block 100 may sequentially enable the first to seventh pipe output control signals POUT_C<0:6> each time the pipe output signal POUT transitions to a specified level when the training control signal Tct is disabled. Further, the data conversion control block 100 may sequentially enable only the first to sixth pipe input control signals PIN_C<0:5> among the first to seventh pipe input control signals PIN_C<0:6> each time the pipe input signal PIN transitions to the specified level when the training control signal Tct is enabled. The data conversion control block 100 may sequentially enable only the first to sixth pipe output control signals POUT_C<0:5> among the first to seventh pipe output control signals POUT_C<0:6> each time the pipe output signal POUT transitions to the specified level when the training control signal Tct is enabled.

The data conversion control block 100 may include a pipe latch input control unit 110, and a pipe latch output control unit 120.

The pipe latch input control unit 110 may generate the first to seventh pipe input control signals PIN_C<0:6> in response to the training control signal Tct and the pipe input signal PIN. For example, the pipe latch input control unit 110 may sequentially enable the first to seventh pipe input control signals PIN_C<0:6> each time the pipe input signal PIN transitions to the specified level (i.e., voltage level or logic voltage level), that is for example, a high level, when the training control signal Tct is disabled. The pipe latch input control unit 110 may sequentially enable only the first to sixth pipe input control signals PIN_C<0:5> among the first to seventh pipe input control signals PIN_C<0:6> each time the pipe input signal PIN transitions to the specified level, that is for example, the high level, when the training control signal Tct is enabled. That is, when the training control signal Tct is enabled, the pipe latch input control unit 110 may retain the seventh pipe input control signal PIN_C<6> to a disabled state.

The pipe latch output control unit 120 may generate the first to seventh pipe output control signals POUT_C<0:6> in response to the training control signal Tct and the pipe output signal POUT. For example, the pipe latch output control unit 120 may sequentially enable the first to seventh pipe output control signals POUT_C<0:6> each time the pipe output signal POUT transitions to the specified level (i.e., voltage level or logic voltage level), that is for example, a high level, when the training control signal Tct is disabled. The pipe latch output control unit 120 may sequentially enable only the first to sixth pipe output control signals POUT_C<0:5> among the first to seventh pipe output control signals POUT_C<0:6> each time the pipe output signal POUT transitions to the specified level, that is for example, the high level, when the training control signal Tct is enabled. When the training control signal Tct is enabled, the pipe latch output control unit 120 may retain the seventh pipe output control signal POUT_C<6> to a disabled state.

The data conversion block 200 may output parallel type first to seventh data Data_p<0:6> as serial data Data_s in response to the first to seventh pipe input control signals PIN_C<0:6> and the first to seventh pipe output control signals POUT_C<0:6>. For example, the data conversion block 200 may receive and latche the first to seventh data Data_p<0:6> in response to the first to seventh pipe input control signals PIN_C<0:6>, and sequentially output latched data as the serial data Data_s in response to the first to seventh pipe output control signals POUT_C<0:6>.

The data conversion block 200 may include first to seventh pipe latches 210, 220, 230, 240, 250, 260 and 270.

The first pipe latch 210 outputs the first data Data_p<0> as the serial data Data_s in response to the first pipe input control signal PIN_C<0> and the first pipe output control signal POUT_C<0>. For example, the first pipe latch 210 receives and latches the first data Data_p<0> when the first pipe input control signal PIN_C<0> is enabled. The first pipe latch 210 outputs latched data as the serial data Data_s when the first pipe output control signal POUT_C<0> is, for example, enabled.

The second pipe latch 220 outputs the second data Data_p<1> as the serial data Data_s in response to the second pipe input control signal PIN_C<1> and the second pipe output control signal POUT_C<1>. For example, the second pipe latch 220 receives and latches the second data Data_p<1> when the second pipe input control signal PIN_C<1> is enabled. The second pipe latch 220 outputs latched data as the serial data Data_s when the second pipe output control signal POUT_C<1> is, for example, enabled.

The third pipe latch 230 outputs the third data Data_p<2> as the serial data Data_s in response to the third pipe input control signal PIN_C<2> and the third pipe output control signal POUT_C<2>. For example, the third pipe latch 230 receives and latches the third data Data_p<2> when the third pipe input control signal PIN_C<2> is enabled. The third pipe latch 230 outputs latched data as the serial data Data_s when the third pipe output control signal POUT_C<2> is, for example, enabled.

The fourth pipe latch 240 outputs the fourth data Data_p<3> as the serial data Data_s in response to the fourth pipe input control signal PIN_C<3> and the fourth pipe output control signal POUT_C<3>. For example, the fourth pipe latch 240 receives and latches the fourth data Data_p<3> when the fourth pipe input control signal PIN_C<3> is enabled. The fourth pipe latch 240 outputs latched data as the serial data Data_s when the fourth pipe output control signal POUT_C<3> is, for example, enabled.

The fifth pipe latch 250 outputs the fifth data Data_p<4> as the serial data Data_s in response to the fifth pipe input control signal PIN_C<4> and the fifth pipe output control signal POUT_C<4>. For example, the fifth pipe latch 250 receives and latches the fifth data Data_p<4> when the fifth pipe input control signal PIN_C<4> is enabled. The fifth pipe latch 250 outputs latched data as the serial data Data_s when the fifth pipe output control signal POUT_C<4> is, for example, enabled.

The sixth pipe latch 260 outputs the sixth data Data_p<5> as the serial data Data_s in response to the sixth pipe input control signal PIN_C<5> and the sixth pipe output control signal POUT_C<5>. For example, the sixth pipe latch 260 receives and latches the sixth data Data_p<5> when the sixth pipe input control signal PIN_C<5> is enabled. The sixth pipe latch 260 outputs latched data as the serial data Data_s when the sixth pipe output control signal POUT_C<5> is, for example, enabled.

The seventh pipe latch 270 outputs the seventh data Data_p<6> as the serial data Data_s in response to the seventh pipe input control signal PIN_C<6> and the seventh pipe output control signal POUT_C<6>. For example, the seventh pipe latch 270 receives and latches the seventh data Data_p<6> when the seventh pipe input control signal PIN_C<6> is enabled. The seventh pipe latch 270 outputs latched data as the serial data Data_s when the seventh pipe output control signal POUT_C<6> is, for example, enabled.

Figure 2:
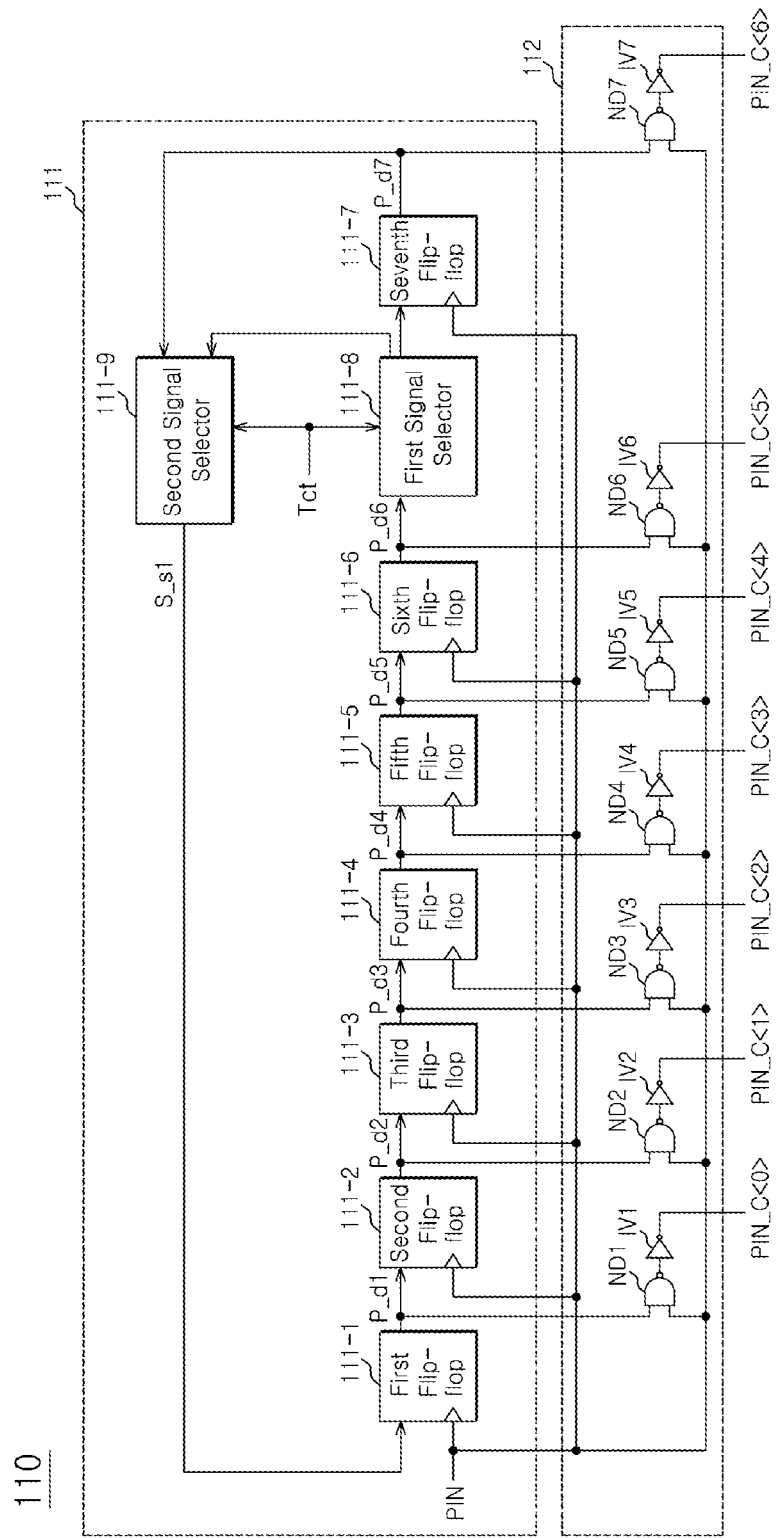
FIG. 2 is a configuration diagram of a representation of an example of the pipe latch input control unit illustrated in FIG. 1.

Referring to FIG. 2, the pipe latch input control unit 110 may include a delayed pipe input signal generating section 111, and a pipe input signal output control section 112.

The delayed pipe input signal generating section 111 may generate first to seventh delayed pipe input signals P_d1, P_d2, P_d3, P_d4, P_d5, P_d6 and P_d7 in response to the pipe input signal PIN when the training control signal Tct is, for example, enabled. For example, the delayed pipe input signal generating section 111 may sequentially enable the first to sixth delayed pipe input signals P_d1 to P_d6 each time the pipe input signal PIN transitions to the specified level when the training control signal Tct is enabled. After sequentially enabling the first to sixth delayed pipe input signals P_d1 to P_d6, the first delayed pipe input signal P_d1 may be enabled again after the sixth delayed pipe input signal P_d6 is enabled. Following the enablement of the first delayed pipe input signal P_d1 the remaining second to sixth delayed pipe input signals P_d2 to P_d6 may be sequentially enabled, as discussed above, repeating the sequence. When the training control signal Tct is enabled, only the first to sixth delayed pipe input signals P_d1 to P_d6 among the first to seventh delayed pipe input signals P_d1 to P_d7 are sequentially enabled, and the seventh delayed pipe input signal P_d7 remains in a disabled state. The delayed pipe input signal generating section 111 may sequentially enable the first to seventh delayed pipe input signals P_d1 to P_d7 in response to the pipe input signal PIN when the training control signal Tct is, for example, disabled. For example, the delayed pipe input signal generating section 111 may sequentially enable the first to seventh delayed pipe input signals P_d1 to P_d7 each time the pipe input signal PIN transitions to the specified level when the training control signal Tct is disabled. The first to seventh delayed pipe input signals P_d1 to P_d7 are sequentially enabled, and the first delayed pipe input signal P_d1 may be enabled again after the seventh delayed pipe input signal P_d7 is enabled. Following the enablement of the first delayed pipe input signal P_d1 the remaining second to seventh delayed pipe input signals P_d2 to P_d7 may be sequentially enabled, as discussed above, repeating the sequence.

The delayed pipe input signal generating section 111 may include first to seventh flip-flops 111-1, 111-2, 111-3, 111-4, 111-5, 111-6 and 111-7. The delayed pipe input signal generating section 111 may also include first and second signal selectors 111-8 and 111-9.

Through the input terminal of the first flip-flop 111-1, the first flip-flop 111-1 may receive a first select signal S_s1. Through the clock input terminal of the first flip-flop 111-1, the first flip-flop 111-1 may receive the pipe input signal PIN. Through the output terminal of the first flip-flop 111-1, the first flip-flop 111-1 may output the first delayed pipe input signal P_d1. Through the input terminal of the second flip-flop 111-2, the second flip-flop 111-2 may receive the first delayed pipe input signal P_d1. Through the clock input terminal of the second flip-flop 111-2, the second flip-flop 111-2 may receive the pipe input signal PIN. Through the output terminal of the second flip-flop 111-2, the second flip-flop 111-2 may output the second delayed pipe input signal P_d2. Through the input terminal of the third flip-flop 111-3, the third flip-flop 111-3 may receive the second delayed pipe input signal P_d2. Through the clock input terminal of the third flip-flop 111-3, the third flip-flop 111-3 may receive the pipe input signal PIN. Through the output terminal of the third flip-flop 111-3, the third flip-flop 111-3 may output the third delayed pipe input signal P_d3. Through the input terminal of the fourth flip-flop 111-4, the fourth flip-flop 111-4 may receive the third delayed pipe input signal P_d3. Through the clock input terminal of the fourth flip-flop 111-4, the fourth flip-flop 111-4 may receive the pipe input signal PIN. Through the output terminal of the fourth flip-flop 111-4, the fourth flip-flop 111-4 may output the fourth delayed pipe input signal P_d4. Through the input terminal of the fifth flip-flop 111-5, the fifth flip-flop 111-5 may receive the fourth delayed pipe input signal P_d4. Through the clock input terminal of the fifth flip-flop 111-5, the fifth flip-flop 111-5 may receive the pipe input signal PIN. Through the output terminal of the fifth flip-flop 111-5, the fifth flip-flop 111-5 may output the fifth delayed pipe input signal P_d5. Through the input terminal of the sixth flip-flop 111-6, the sixth flip-flop 111-6 may receive the fifth delayed pipe input signal P_d5. Through the clock input terminal of the sixth flip-flop 111-6, the sixth flip-flop 111-6 may receive the pipe input signal PIN. Through the output terminal of the sixth flip-flop 111-6, the sixth flip-flop 111-6 may output the sixth delayed pipe input signal P_d6. Through the input terminal of the seventh flip-flop 111-7, the seventh flip-flop 111-7 may receive the output signal of the first signal selector 111-8. Through the clock input terminal of the seventh flip-flop 111-7, the seventh flip-flop 111-7 may receive the pipe input signal PIN. Through the output terminal of the seventh flip-flop 111-7, the seventh flip-flop 111-7 may output the seventh delayed pipe input signal P_d7. The first signal selector 111-8 outputs the sixth delayed pipe input signal P_d6 to the second signal selector 111-9 or the seventh flip-flop 111-7 depending on the training control signal Tct. For example, the first signal selector 111-8 may output the sixth delayed pipe input signal P_d6 to the second signal selector 111-9 when the training control signal Tct is enabled. Also for example, the first signal selector 111-8 may output the sixth delayed pipe input signal P_d6 to the seventh flip-flop 111-7 when the training control signal Tct is disabled. The first signal selector 111-8 may be constituted by, for example but not limited to, a demultiplexer. In response to the training control signal Tct, the second signal selector 111-9 may output the output signal of either the first signal selector 111-8 or the seventh flip-flop 111-7, as the first select signal S_s1. For example, the second signal selector 111-9 may output the output signal of the first signal selector 111-8 as the first select signal S_s1 when the training control signal Tct is enabled. Also for example, when the training control signal Tct is disabled, the second signal selector 111-9 may output the output signal of the seventh flip-flop 111-7, that is, the seventh delayed pipe input signal P_d7, as the first select signal S_s1. The second signal selector 111-9 may be constituted by, for example but not limited to, a multiplexer.

The pipe input signal output control section 112 may output the output signals of the delayed pipe input signal generating section 111. The first to seventh delayed pipe input signals P_d1 to P_d7 may be outputted as the first to seventh pipe input control signals PIN_C<0:6>, when the pipe input signal PIN has the specified level. For example, the pipe input signal output control section 112 outputs the first to seventh delayed pipe input signals P_d1 to P_d7, as the first to seventh pipe input control signals PIN_C<0:6>, when the pipe input signal PIN is enabled. However, when the pipe input signal PIN is disabled, the pipe input signal output control section 112 disables the first to seventh pipe input control signals PIN_C<0:6> regardless of the first to seventh delayed pipe input signals P_d1 to P_d7.

The pipe input signal output control section 112 may include first to seventh NAND gates ND1, ND2, ND3, ND4, ND5, ND6 and ND7. Additionally, the pipe input signal output control section 112 may include first to seventh inverters IV1, IV2, IV3, IV4, IV5, IV6 and IV7.

The first NAND gate ND1 may receive the first delayed pipe input signal P_d1 and the pipe input signal PIN. The first inverter IV1 may receive the output signal of the first NAND gate ND1, and may output the first pipe input control signal PIN_C<0>. The second NAND gate ND2 may receive the second delayed pipe input signal P_d2 and the pipe input signal PIN. The second inverter IV2 may receive the output signal of the second NAND gate ND2, and may output the second pipe input control signal PIN_C<1>. The third NAND gate ND3 may receive the third delayed pipe input signal P_d3 and the pipe input signal PIN. The third inverter IV3 may receive the output signal of the third NAND gate ND3, and may output the third pipe input control signal PIN_C<2>. The fourth NAND gate ND4 may receive the fourth delayed pipe input signal P_d4 and the pipe input signal PIN. The fourth inverter IV4 may receive the output signal of the fourth NAND gate ND4, and may output the fourth pipe input control signal PIN_C<3>. The fifth NAND gate ND5 may receive the fifth delayed pipe input signal P_d5 and the pipe input signal PIN. The fifth inverter IV5 may receive the output signal of the fifth NAND gate ND5, and may output the fifth pipe input control signal PIN_C<4>. The sixth NAND gate ND6 may receive the sixth delayed pipe input signal P_d6 and the pipe input signal PIN. The sixth inverter IV6 may receive the output signal of the sixth NAND gate ND6, and may output the sixth pipe input control signal PIN_C<5>. The seventh NAND gate ND7 may receive the seventh delayed pipe input signal P_d7 and the pipe input signal PIN. The seventh inverter IV7 may receive the output signal of the seventh NAND gate ND7, and may output the seventh pipe input control signal PIN_C<6>.

Figure 6:
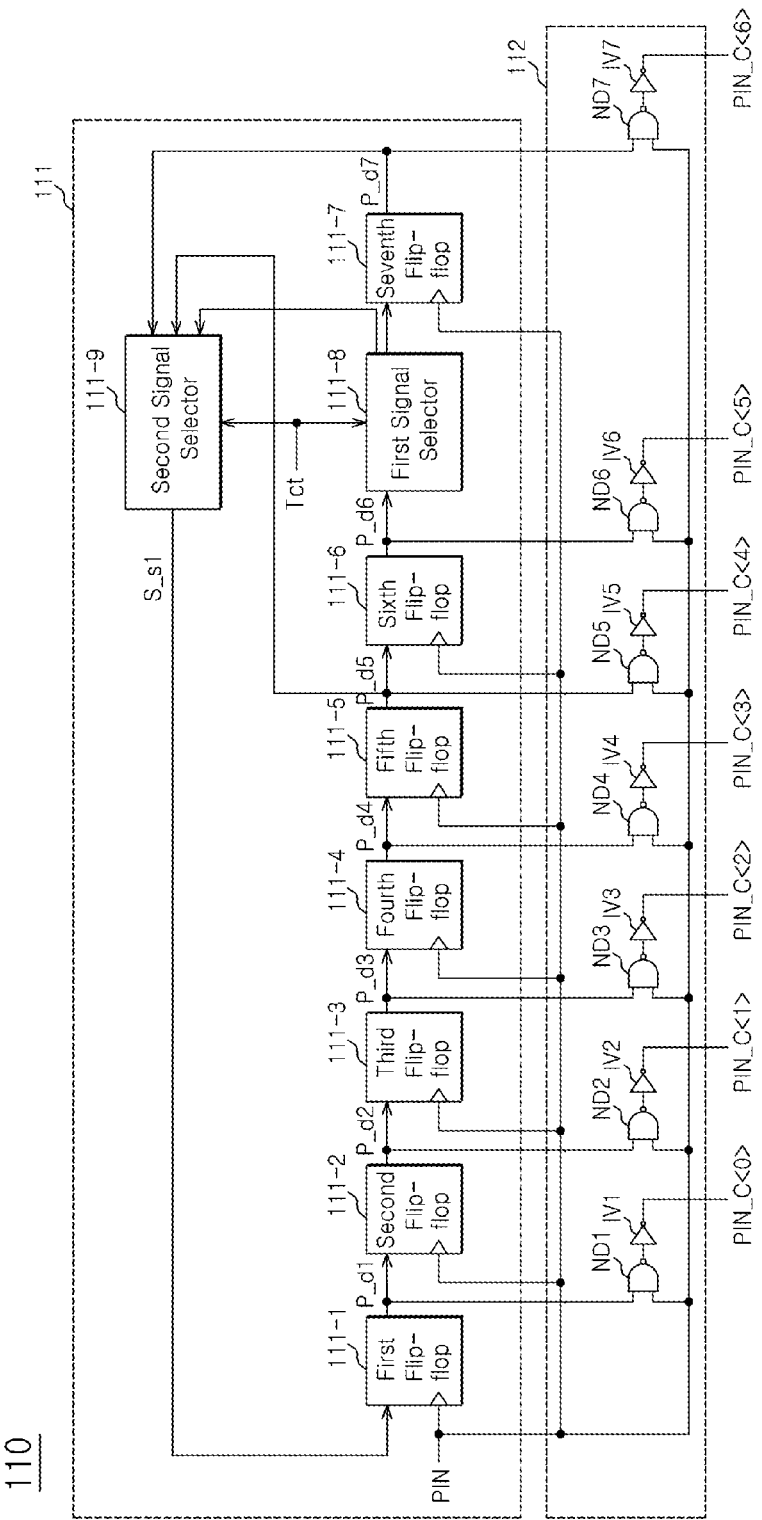
FIG. 6 is a configuration diagram of a representation of an example of the pipe latch input control unit illustrated in FIG. 1.

An embodiment of the pipe latch input control unit 110 is illustrated in FIG. 6, and may be configured in the same manner as shown in FIG. 2 except that the second signal selector 111-9 may select one of the output signals P_d5, P_d6 and P_d7 of the fifth flip-flop 111-5, the sixth flip-flop 111-6 and the seventh flip-flop 111-7 in response to the training control signal Tct and then may output the first select signal S_s1. The first select signal S_s1 includes one of the output signals P_d5, P_d6 or P_d7 depending on the training control signal Tct. Also, since the output signal P_d6 of the sixth flip-flop 111-6 is transferred to the second signal selector 111-9 by the first signal selector 111-8, the output signal of the first signal selector 111-8 is the same as the output signal P_d6 of the sixth flip-flop 111-6.

Figure 3:
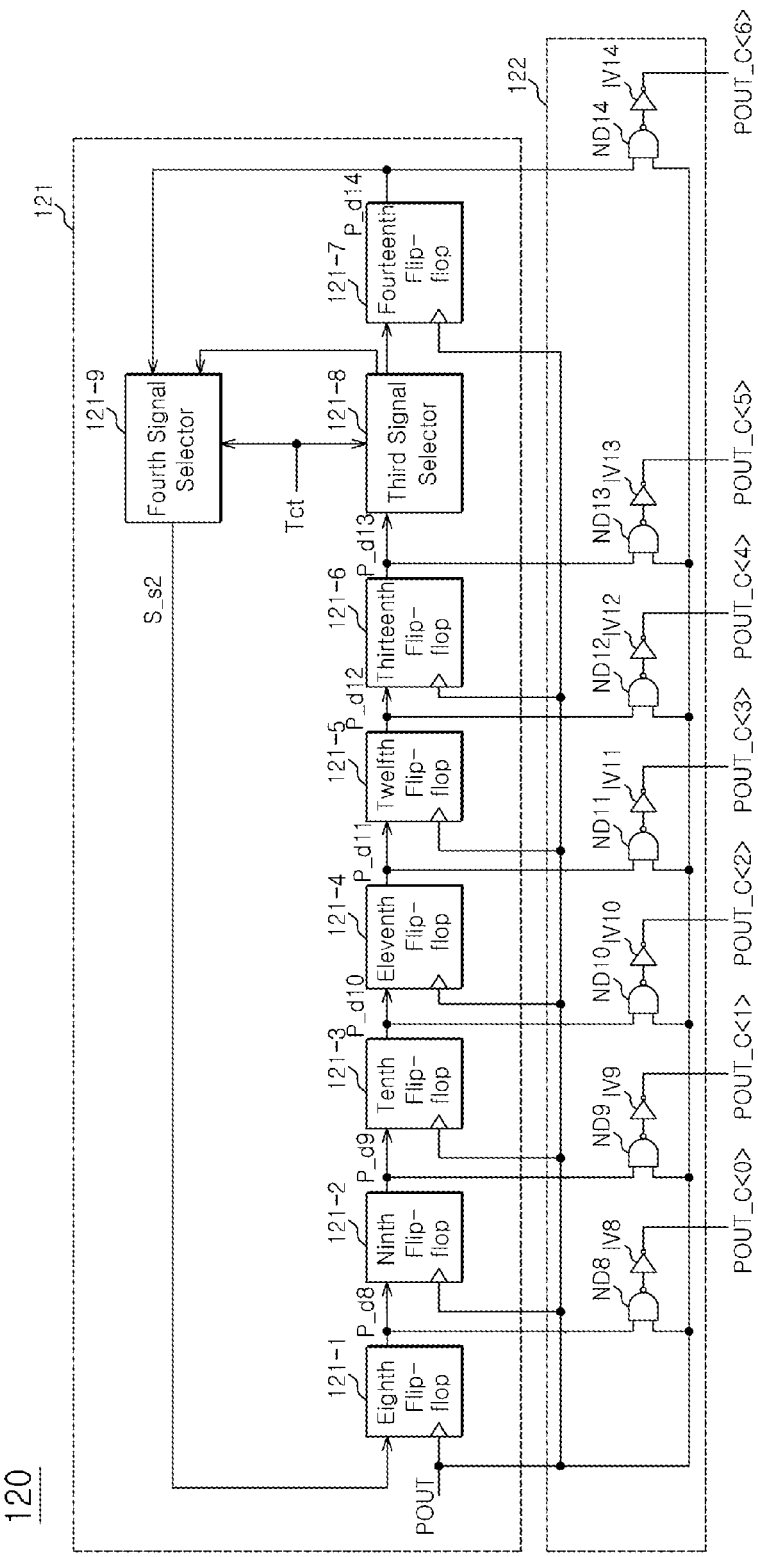
FIG. 3 is a configuration diagram of a representation of an example of the pipe latch output control unit illustrated in FIG. 1.

Referring to FIG. 3, the pipe latch output control unit 120 may include a delayed pipe output signal generating section 121, and a pipe output signal output control section 122.

The delayed pipe output signal generating section 121 may generate first to seventh delayed pipe output signals P_d8, P_d9, P_d10, P_d11, P_d12, P_d13 and P_d14 in response to the pipe output signal POUT when the training control signal Tct is, for example, enabled. For example, the delayed pipe output signal generating section 121 may sequentially enable the first to sixth delayed pipe output signals P_d8 to P_d13 each time the pipe output signal POUT transitions to the specified level when the training control signal Tct is enabled. The first to sixth delayed pipe output signals P_d8 to P_d13 may be sequentially enabled, and the first delayed pipe output signal P_d8 may be enabled again after the sixth delayed pipe output signal P_d13 is enabled. Following the enablement of the first delayed pipe output signal P_d8 the remaining second to sixth signals P_d9 to P_d13 may be sequentially enabled, as discussed above, repeating the sequence. When the training control signal Tct is enabled, only the first to sixth delayed pipe output signals P_d8 to P_d13 among the first to seventh delayed pipe output signals P_d8 to P_d14 are sequentially enabled, and the seventh delayed pipe output signal P_d14 remains in a disabled state. The delayed pipe output signal generating section 121 may sequentially enable the first to seventh delayed pipe output signals P_d8 to P_d14 in response to the pipe output signal POUT when the training control signal Tct is disabled. For example, the delayed pipe output signal generating section 121 sequentially enables the first to seventh delayed pipe output signals P_d8 to P_d14 each time the pipe output signal POUT transitions to the specified level when the training control signal Tct is disabled. The first to seventh delayed pipe output signals P_d8 to P_d14 may be sequentially enabled, and the first delayed pipe output signal P_d8 may be enabled again after the seventh delayed pipe output signal P_d14 is enabled. Following the enablement of the first delayed pipe output signal P_d8 the remaining second to seventh delayed pipe output signals P_d9 to P_d14 may be sequentially enabled, as discussed above, repeating the sequence.

The delayed pipe output signal generating section 121 may include eighth to fourteenth flip-flops 121-1, 121-2, 121-3, 121-4, 121-5, 121-6 and 121-7, and third and fourth signal selectors 121-8 and 121-9.

Through the input terminal of the eighth flip-flop 121-1, the eighth flip-flop 121-1 may receive a second select signal S_s2. Through the clock input terminal of the eighth flip-flop 121-1, the eighth flip-flop 121-1 may receive the pipe output signal POUT. Through the output terminal of the eighth flip-flop 121-1, the eighth flip-flop 121-1 may output the first delayed pipe output signal P_d8. Through the input terminal of the ninth flip-flop 121-2, the ninth flip-flop 121-2 may receive the first delayed pipe output signal P_d8. Through the clock input signal of the ninth flip-flop 121-2, the ninth flip-flop 121-2 may receive the pipe output signal POUT. Through the output terminal of the ninth flip-flop 121-2, the ninth flip-flop 121-2 may output the second delayed pipe output signal P_d9. Through the input terminal of the tenth flip-flop 121-3, the tenth flip-flop 121-3 may receive the second delayed pipe output signal P_d9. Through the clock input terminal of the tenth flip-flop 121-3, the tenth flip-flop 121-3 may receive the pipe output signal POUT. Through the output terminal of the tenth flip-flop 121-3, the tenth flip-flop 121-3 may output the third delayed pipe output signal P_d10. Through the input terminal of the eleventh flip-flop 121-4, the eleventh flip-flop 121-4 may receive the third delayed pipe output signal P_d10. Through the clock input terminal of the eleventh flip-flop 121-4, the eleventh flip-flop 121-4 may receive the pipe output signal POUT. Through the output terminal of the eleventh flip-flop 121-4, the eleventh flip-flop 121-4 may output the fourth delayed pipe output signal P_d11. Through the input terminal of the twelfth flip-flop 121-5, the twelfth flip-flop 121-5 may receive the fourth delayed pipe output signal P_d11. Through the clock input terminal of the twelfth flip-flop 121-5, the twelfth flip-flop 121-5 may receive the pipe output signal POUT. Through the output terminal of the twelfth flip-flop 121-5, the twelfth flip-flop 121-5 may output the fifth delayed pipe output signal P_d12. Through the thirteenth flip-flop 121-6, the thirteenth flip-flop 121-6 may receive the fifth delayed pipe output signal P_d12. Through the clock input terminal of the thirteenth flip-flop 121-6, the thirteenth flip-flop 121-6 may receive the pipe output signal POUT. Through the output terminal of the thirteenth flip-flop 121-6, the thirteenth flip-flop 121-6 may output the sixth delayed pipe output signal P_d13. Through the input terminal of the fourteenth flip-flop 121-7, the fourteenth flip-flop 121-7 may receive the output signal of the third signal selector 121-8. Through the clock input terminal of the fourteenth flip-flop 121-7, the fourteenth flip-flop 121-7 may receive the pipe output signal POUT. Through the output terminal of the fourteenth flip-flop 121-7, the fourteenth flip-flop 121-7 may output the seventh delayed pipe output signal P_d14. The third signal selector 121-8 may output the sixth delayed pipe output signal P_d13 as the input signal of either the second signal selector 121-9 or the fourteenth flip-flop 121-7, in response to the training control signal Tct. For example, the third signal selector 121-8 may output the sixth delayed pipe output signal P_d13 as the input signal of the fourth signal selector 121-9 when the training control signal Tct is enabled. Also for example, the third signal selector 121-8 may output the sixth delayed pipe output signal P_d13 as the input signal of the fourteenth flip-flop 121-7 when the training control signal Tct is disabled. The third signal selector 121-8 may be constituted by, for example but not limited to, a demultiplexer. The fourth signal selector 121-9 may output the output signal of either the third signal selector 121-8 or the fourteenth flip-flop 121-7, as the second select signal S_s2, in response to the training control signal Tct. For example, the fourth signal selector 121-9 outputs the output signal of the third signal selector 121-8 as the second select signal S_s2 when the training control signal Tct is enabled. Also for example, the fourth signal selector 121-9 outputs the output signal of the fourteenth flip-flop 121-7, that is, the seventh delayed pipe output signal P_d14, as the second select signal S_s2 when the training control signal Tct is disabled. The fourth signal selector 121-9 may be constituted by, for example but not limited to, a multiplexer.

The pipe output signal output control section 122 may output the output signals of the delayed pipe output signal generating section 121. The first to seventh delayed pipe output signals P_d8 to P_d14 may be outputted as the first to seventh pipe output control signals POUT_C<0:6>, when the pipe output signal POUT has the specified level. For example, the pipe output signal output control section 122 outputs the first to seventh delayed pipe output signals P_d8 to P_d14, as the first to seventh pipe output control signals POUT_C<0:6>, when the pipe output signal POUT is enabled. However, when the pipe output signal POUT is disabled, the pipe output signal output control section 122 disables the first to seventh pipe output control signals POUT_C<0:6> regardless of the first to seventh delayed pipe output signals P_d8 to P_d14.

The pipe output signal output control section 122 may include eighth to fourteenth NAND gates ND8, ND9, ND10, ND11, ND12, ND13 and ND14. Additionally, the pipe output signal output control section 122 may include eighth to fourteenth inverters IV8, IV9, IV10, IV11, IV12, IV13 and IV14.

The eighth NAND gate ND8 may receive the first delayed pipe output signal P_d8 and the pipe output signal POUT. The eighth inverter IV8 may receive the output signal of the eighth NAND gate ND8, and may output the first pipe output control signal POUT_C<0>. The ninth NAND gate ND9 may receive the second delayed pipe output signal P_d9 and the pipe output signal POUT. The ninth inverter IV9 may receive the output signal of the ninth NAND gate ND9, and may output the second pipe output control signal POUT_C<1>. The tenth NAND gate ND10 may receive the third delayed pipe output signal P_d10 and the pipe output signal POUT. The tenth inverter IV10 may receive the output signal of the tenth NAND gate ND10, and may output the third pipe output control signal POUT_C<2>. The eleventh NAND gate ND11 may receive the fourth delayed pipe output signal P_d11 and the pipe output signal POUT. The eleventh inverter IV11 may receive the output signal of the eleventh NAND gate ND11, and may output the fourth pipe output control signal POUT_C<3>. The twelfth NAND gate ND12 may receive the fifth delayed pipe output signal P_d12 and the pipe output signal POUT. The twelfth inverter IV12 may receive the output signal of the twelfth NAND gate ND12, and may output the fifth pipe output control signal POUT_C<4>. The thirteenth NAND gate ND13 may receive the sixth delayed pipe output signal P_d13 and the pipe output signal POUT. The thirteenth inverter IV13 may receive the output signal of the thirteenth NAND gate ND13, and may output the sixth pipe output control signal POUT_C<5>. The fourteenth NAND gate ND14 may receive the seventh delayed pipe output signal P_d14 and the pipe output signal POUT. The fourteenth inverter IV14 may receive the output signal of the fourteenth NAND gate ND14, and may output the seventh pipe output control signal POUT_C<6>.

Figure 7:
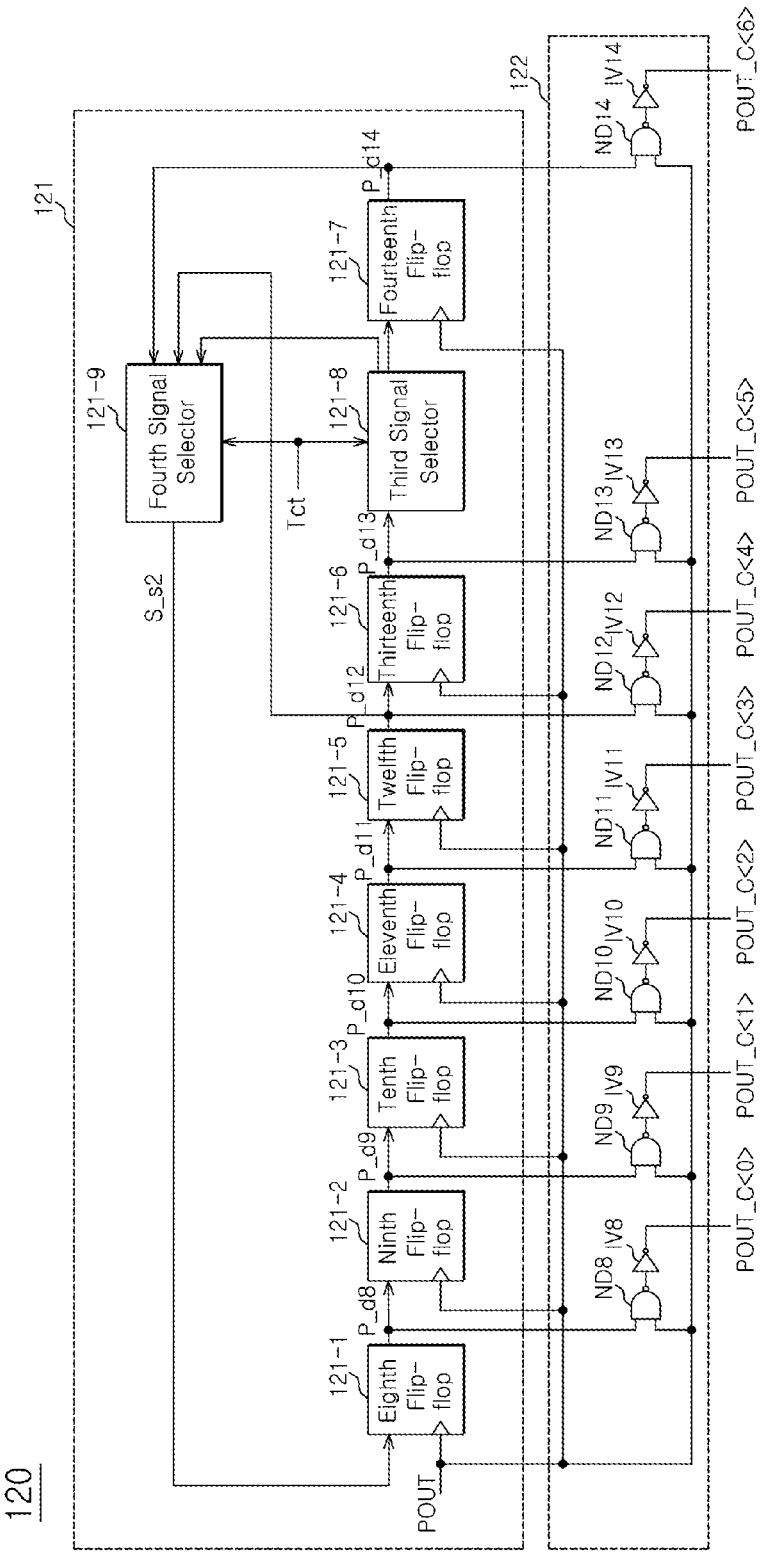
FIG. 7 is a configuration diagram of a representation of an example of the pipe latch output control unit illustrated in FIG. 1.

An embodiment of the pipe latch output control unit 120 is illustrated in FIG. 7, and may be configured in the same manner as shown in FIG. 3 except that the fourth signal selector 121-9 may select one of the output signals P_d12, P_d13 and P_d14 of the twelfth flip-flop 121-5, the thirteenth flip-flop 121-6 and the fourteenth flip-flop 121-7 in response to the training control signal Tct and then may output the second select signal S_s2. The second select signal S_s2 includes one of the output signals P_d12, P_d13 or P_d14 depending on the training control signal Tct. Also, since the output signal P_d13 of the thirteenth flip-flop 121-6 is transferred to the fourth signal selector 121-9 by the third signal selector 121-8, the output signal of the third signal selector 121-8 is the same as the output signal P_d13 of the thirteenth flip-flop 121-6.

Operations of the semiconductor memory apparatus in accordance with an embodiment, configured as mentioned above, will be described below.

Referring to FIG. 2, if the training control signal Tct is enabled, the sixth delayed pipe input signal P_d6 is inputted to the first flip-flop 111-1 as the first select signal S_s1 through the first and second signal selectors 111-8 and 111-9.

That is to say, if the training control signal Tct is enabled, a loop constituted by the first to sixth flip-flops 111-1 to 111-6 is formed, and the output signal of the sixth flip-flop 111-6 is inputted again as the input signal of the first flip-flop 111-1.

Therefore, the first to sixth delayed pipe input signals P_d1 to P_d6 are sequentially enabled each time the pipe input signal PIN transitions to the specified level, that is for example, the high level, and the first delayed pipe input signal P_d1 is enabled when the pipe input signal PIN becomes again the high level after the sixth delayed pipe input signal P_d6 is enabled.

Figure 4:
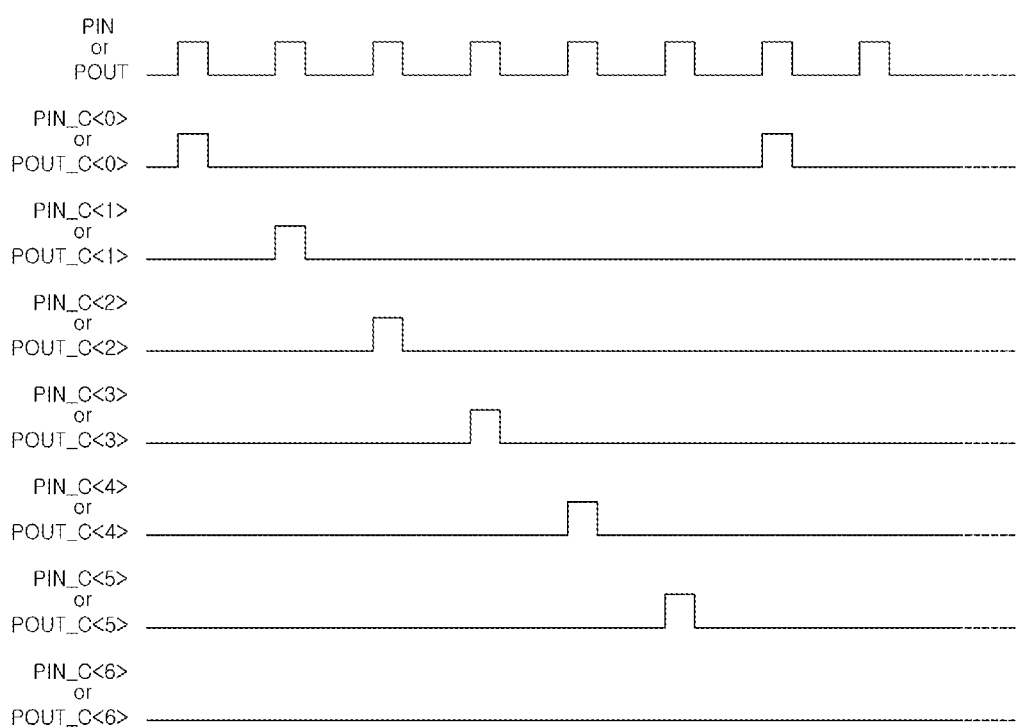
FIGS. 4 and 5 are timing diagrams that may be used for explaining the operations of the semiconductor memory apparatus in accordance with an embodiment.

Accordingly, as illustrated in FIG. 4, the pipe latch input control unit 110 outputs the output signals of the first to sixth flip-flops 111-1 to 111-6 which are sequentially enabled each time the pipe input signal PIN transitions to the high level, that is, the first to sixth delayed pipe input signals P_d1 to P_d6, as the first to sixth pipe input control signals PIN_C<0:5>.

If the training control signal Tct is disabled, the seventh delayed pipe input signal P_d7 is inputted as the input signal of the first flip-flop 111-1, as the first select signal S_s1, through the second signal selector 111-9.

Namely, if the training control signal Tct is disabled, a loop constituted by the first to seventh flip-flops 111-1 to 111-7 is formed, and the output signal of the seventh flip-flop 111-7 is inputted again as the input signal of the first flip-flop 111-1.

Therefore, the first to seventh delayed pipe input signals P_d1 to P_d7 are sequentially enabled each time the pipe input signal PIN transitions to the specified level, that is for example, the high level, and the first delayed pipe input signal P_d1 is enabled when the pipe input signal PIN becomes again the high level after the seventh delayed pipe input signal P_d7 is enabled.

Figure 5:
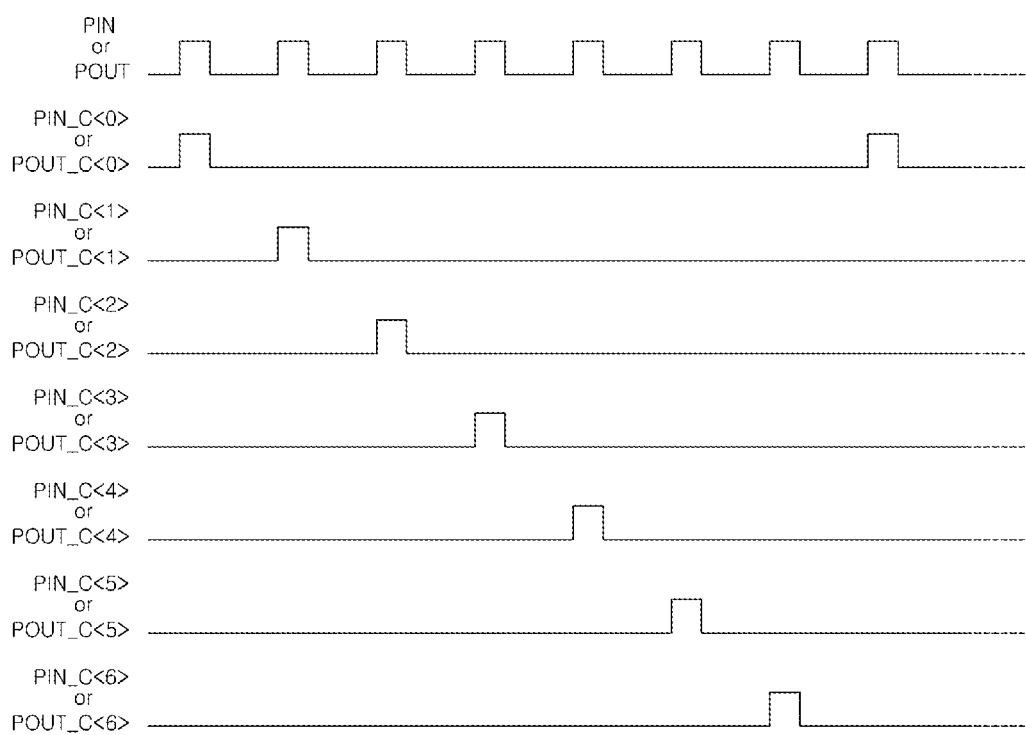

Accordingly, as illustrated in FIG. 5, the pipe latch input control unit 110 outputs the output signals of the first to seventh flip-flops 111-1 to 111-7 which are sequentially enabled each time the pipe input signal PIN transitions to the high level, that is, the first to seventh delayed pipe input signals P_d1 to P_d7, as the first to seventh pipe input control signals PIN_C<0:6>.

Referring to FIG. 3, if the training control signal Tct is enabled, the sixth delayed pipe output signal P_d13 is inputted to the eighth flip-flop 121-1 as the second select signal S_s2 through the third and fourth signal selectors 121-8 and 121-9.

That is to say, if the training control signal Tct is enabled, a loop constituted by the eighth to thirteenth flip-flops 121-1 to 121-6 is formed, and the output signal of the thirteenth flip-flop 121-6 is inputted again as the input signal of the eighth flip-flop 121-1.

Therefore, the first to sixth delayed pipe output signals P_d8 to P_d13 are sequentially enabled each time the pipe output signal POUT transitions to the specified level, that is for example, the high level, and the first delayed pipe output signal P_d8 is enabled when the pipe output signal POUT becomes again the high level after the sixth delayed pipe output signal P_d13 is enabled.

Accordingly, as illustrated in FIG. 4, the pipe latch output control unit 120 outputs the output signals of the eighth to thirteenth flip-flops 121-1 to 121-6 which are sequentially enabled each time the pipe output signal POUT transitions to the high level, that is, the first to sixth delayed pipe output signals P_d8 to P_d13, as the first to sixth pipe output control signals POUT_C<0:5>.

If the training control signal Tct is disabled, the seventh delayed pipe output signal P_d14 is inputted as the input signal of the eighth flip-flop 121-1, as the second select signal S_s2, through the fourth signal selector 121-9.

Namely, if the training control signal Tct is disabled, a loop constituted by the eighth to fourteenth flip-flops 121-1 to 121-7 is formed, and the output signal of the fourteenth flip-flop 121-7 is inputted again as the input signal of the eighth flip-flop 121-1.

Therefore, the first to seventh delayed pipe output signals P_d8 to P_d14 are sequentially enabled each time the pipe output signal POUT transitions to the specified level, that is for example, the high level, and the first delayed pipe output signal P_d8 is enabled when the pipe output signal POUT becomes again the high level after the seventh delayed pipe output signal P_d14 is enabled.

Accordingly, as illustrated in FIG. 5, the pipe latch output control unit 120 outputs the output signals of the eighth to fourteenth flip-flops 121-1 to 121-7 which are sequentially enabled each time the pipe output signal POUT transitions to the high level, that is, the first to seventh delayed pipe output signals P_d8 to P_d14, as the first to seventh pipe output control signals POUT_C<0:6>.

As a result, the semiconductor memory apparatus according to an embodiment may generate the 6 pipe input control signals PIN_C<0:5> and the 6 pipe output control signals POUT_C<0:5> or generate the 7 pipe input control signals PIN_C<0:6> and the 7 pipe output control signals POUT_C<0:6>, in response to the training control signal Tct. If the 6 pipe input control signals PIN_C<0:5> and the 6 pipe output control signals POUT_C<0:5> are generated, the 6 pipe latches 210, 220, 230, 240, 250 and 260 output the 6 data Data_p<0:5> as the serial data Data_s. Further, if the 7 pipe input control signals PIN_C<0:6> and the 7 pipe output control signals POUT_C<0:6> are generated, the 7 pipe latches 210, 220, 230, 240, 250, 260 and 270 output the 7 data Data_p<0:6> as the serial data Data_s.

As is apparent from the above descriptions, in the semiconductor memory apparatus in accordance with an embodiment, by controlling the numbers of pipe input control signals and pipe output control signals which are sequentially enabled in response to a training control signal, the number of pipe latches responding to the pipe input control signals and the pipe output control signals may be controlled. Accordingly, after the semiconductor memory apparatus in accordance with the embodiments is mounted to a system, when performing a training operation (in which the training control signal is enabled), since a different number of pipe latches may be used when compared to a normal operation (in which the training control signal is disabled), it is possible to satisfy a training specification with respect to the system, and an operation desired by a user may be performed in the normal operation.

Figure 8:
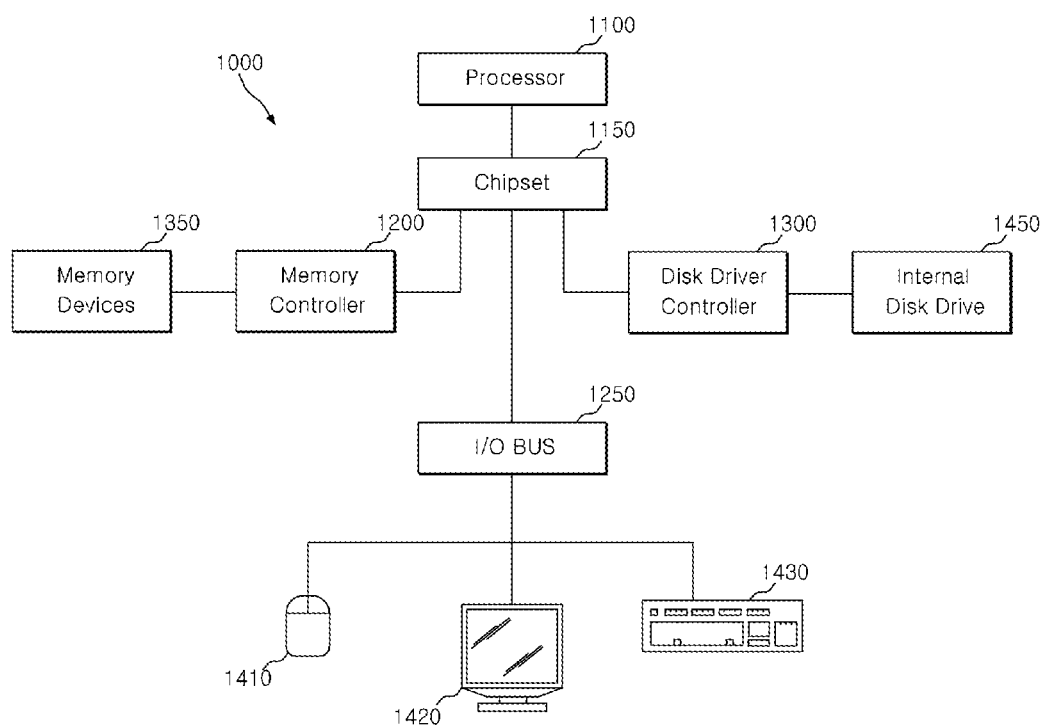
FIG. 8 illustrates a block diagram representation of an example of a system employing the semiconductor memory apparatus in accordance with the embodiments discussed above with relation to FIGS. 1-7.

The semiconductor memory apparatus discussed above is particular useful in the design of memory devices, processors, and computer systems. For example, referring to FIG. 8, a block diagram of a system employing the semiconductor memory apparatus in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor memory apparatus as discussed above with reference to FIGS. 1-7. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the semiconductor memory apparatus as discussed above with relation to FIGS. 1-7, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 8 is merely one example of a system employing the semiconductor memory apparatus as discussed above with relation to FIGS. 1-7. In alternate embodiments, such as cellular phones or digital cameras, the components may differ from the embodiments illustrated in FIG. 8.

While various embodiments have been described above, it will be understood to those skilled in the art that the embodiments described are by way of example only. Accordingly, the semiconductor memory apparatus described herein should not be limited based on the described embodiments.

What is claimed is:

1. A semiconductor memory apparatus comprising:
a data conversion control block configured to control the number of pipe input control signals and the number of pipe output control signals which are enabled, in response to a training control signal; and
a data conversion block configured to receive parallel data and output serial data, in response to the pipe input control signals and the pipe output control signals,
wherein the data conversion control block is configured to form a loop by selecting a first number of flip-flops dependent on the training control signal and selecting a second number of flip-flops dependent on the training control signal,
wherein the first number of flip-flops and the second number of flip-flops are different,
wherein the pipe input control signals are sequentially enabled,
wherein the pipe output control signals are sequentially enabled,
wherein the data conversion control block generates fewer numbers of pipe input control signals and pipe output control signals when the training control signal is enabled than when the training control signal is disabled,
wherein the data conversion control block comprises:
a pipe latch input control unit configured to generate the pipe input control signals in response to a pipe input signal and the training control signal; and
a pipe latch output control unit configured to generate the pipe output control signals in response to a pipe output signal and the training control signal,
wherein the pipe latch input control unit comprises:
a delayed pipe input signal generating section configured to generate delayed pipe input signals in response to the pipe input signal and the training control signal; and
a pipe input signal output control section configured to output the delayed pipe input signals as the pipe input control signals when the pipe input signal has a specified level,
wherein the delayed pipe input signal generating section comprises a plurality of flip-flops which are connected in series, and
wherein the delayed pipe input signal generating section selects, as an input signal to a first flip-flop among the plurality of flip-flops, an output signal of one of remaining flip-flops in response to the training control signal,
wherein the delayed pipe input signal generating section comprises first to sixth flip-flops which are connected in series, a seventh flip-flop, a first signal selector, and a second signal selector,
wherein the first signal selector transfers an output signal of the sixth flip-flop to either the seventh flip-flop or the second signal selector in response to the training control signal,
wherein the second signal selector transfers an output signal of either the first signal selector or the seventh flip-flop to the first flip-flop in response to the training control signal,
wherein the first to seventh flip-flops receive and output their input signals each time the pipe input signal transitions to the specified level, and
wherein output signals of the first to seventh flip-flops output the delayed pipe input signals.

2. The semiconductor memory apparatus according to claim 1,
wherein the second signal selector transfers an output signal of one of the first signal selector, the seventh flip-flop, or the fifth flip-flop to the first flip-flop in response to the training control signal.

3. The semiconductor memory apparatus according to claim 1, wherein the pipe latch output control unit comprises:
a delayed pipe output signal generating section configured to generate delayed pipe output signals in response to the pipe output signal and the training control signal; and
a pipe output signal output control section configured to output the delayed pipe output signals as the pipe output control signals when the pipe output signal has a specified level.

4. The semiconductor memory apparatus according to claim 3,
wherein the delayed pipe output signal generating section comprises a plurality of flip-flops which are connected in series, and
wherein the delayed pipe output signal generating section selects, as an input signal to a first flip-flop among the plurality of flip-flops, an output signal of one of remaining flip-flops in response to the training control signal.

5. The semiconductor memory apparatus according to claim 4,
wherein the delayed pipe output signal generating section comprises first to sixth flip-flops which are connected in series, a seventh flip-flop, a first signal selector, and a second signal selector,
wherein the first signal selector transfers an output signal of the sixth flip-flop to either the seventh flip-flop or the second signal selector in response to the training control signal,
wherein the second signal selector transfers an output signal of either the first signal selector or the seventh flip-flop to the first flip-flop in response to the training control signal,
wherein the first to seventh flip-flops receive and output their input signals each time the pipe output signal transitions to the specified level, and
wherein output signals of the first to seventh flip-flops output the delayed pipe output signals.

6. The semiconductor memory apparatus according to claim 5,
wherein the second signal selector transfers an output signal of one of the first signal selector, the seventh flip-flop, or the fifth flip-flop to the first flip-flop in response to the training control signal.

7. A semiconductor memory apparatus comprising:
a data conversion block including a plurality of pipe latches, and configured to sequentially output a plurality of parallel data as serial data by using the plurality of pipe latches; and
a data conversion control block configured to generate pipe input control signals by delaying the pipe input signal, generates pipe output control signals by delaying the pipe input signal, select the number of the pipe latches in response to a training control signal, the pipe input control signals and the pipe output control signals, and control the data conversion block to output the same number of parallel data as the selected number of the pipe latches, as the serial data, wherein the data conversion control block is configured to form a loop by selecting a first number of flip-flops dependent on the training control signal and selecting a second number of flip-flops dependent on the training control signal, wherein the first number of flip-flops and the second number of flip-flops are different, wherein the plurality of respective pipe latches receive and store data when pipe input control signals are enabled, and output stored data as the serial data when pipe output control signals are enabled, wherein the data conversion control block controls the number of the pipe input control signals and the number of the pipe output control signals which are sequentially enabled, in response to the training control signal, the pipe input signal and the pipe output signal, wherein the data conversion control block comprises:

a pipe latch input control unit configured to control the number of the pipe input control signals which are sequentially enabled, in response to the training control signal and the pipe input signal; and a pipe latch output control unit configured to control the number of the pipe output control signals which are sequentially enabled, in response to the training control signal and the pipe output signal, wherein the pipe latch input control unit sequentially enables a fewer number of pipe input control signals when the training control signal is enabled than when the training control signal is disabled, wherein the pipe latch input control unit comprises:

a delayed pipe input signal generating section configured to form a loop by first to seventh flip-flops or by the first to sixth flip-flops in response to the training control signal, the first to seventh flip-flops respectively generating delayed pipe input signals; and a pipe input signal output control section configured to output the delayed pipe input signals as the pipe input control signals when the pipe input signal has a specified level, and wherein the first to seventh flip-flops receive and output their input signals in response to the pipe input signal.

8. The semiconductor memory apparatus according to claim 7, wherein the pipe latch output control unit sequentially enables a smaller number of pipe output control signals when the training control signal is enabled than when the training control signal is disabled.

9. The semiconductor memory apparatus according to claim 8, wherein the pipe latch output control unit comprises:

a delayed pipe output signal generating section configured to form a loop by first to seventh flip-flops or by the first to sixth flip-flops in response to the training control signal, the first to seventh flip-flops respectively generating delayed pipe output signals; and a pipe output signal output control section configured to output the delayed pipe output signals as the pipe output control signals when the pipe output signal has a specified level, and wherein the first to seventh flip-flops receive and output their input signals in response to the pipe output signal.

* * * * *